United States Patent [19]

Enge

[11] 4,276,477
[45] Jun. 30, 1981

[54] FOCUSING APPARATUS FOR UNIFORM APPLICATION OF CHARGED PARTICLE BEAM

[75] Inventor: Harald A. Enge, Winchester, Mass.

[73] Assignee: Varian Associates, Inc., Palo Alto, Calif.

[21] Appl. No.: 76,011

[22] Filed: Sep. 17, 1979

[51] Int. Cl.³ .......................... G01K 1/08; H21J 3/14
[52] U.S. Cl. ................................ 250/398; 250/492 A
[58] Field of Search ............... 250/492 A, 492 B, 398, 250/396 ML, 396 R, 296; 313/359, 361, 426, 431

[56] References Cited

U.S. PATENT DOCUMENTS

| 3,956,635 | 5/1976 | Chang | 250/492 A |
| 4,066,895 | 1/1978 | Fwanaga | 250/296 |
| 4,117,339 | 9/1978 | Wolfe | 250/492 A |
| 4,140,913 | 2/1979 | Anger | 250/492 A |

*Primary Examiner*—Bruce C. Anderson

*Attorney, Agent, or Firm*—Stanley Z. Cole; Norman E. Reitz

[57] ABSTRACT

An apparatus for performing double deflection scanning of charged particle beams utilizes a means for introducing variations in the angle of the charged particle beam in combination with the focal or optical properties of a sector magnet. The means for introducing angular variations receives a charged particle beam and varies the angle of, i.e., deflects, the beam in a plane to define a time modulated fan beam. Once the beam angle is varied the beam is introduced to the gap between the poles of a sector electromagnet operating in a direct current mode. The focal properties of the sector electromagnet translates the time modulated fan beam into a time modulated parallel beam. The parallel beam is double deflected and may be used, for example, as the substrate impinging beam in ion implantation equipment. Multiple sector magnets may be employed for multiple end stations.

11 Claims, 5 Drawing Figures

FIG. 3
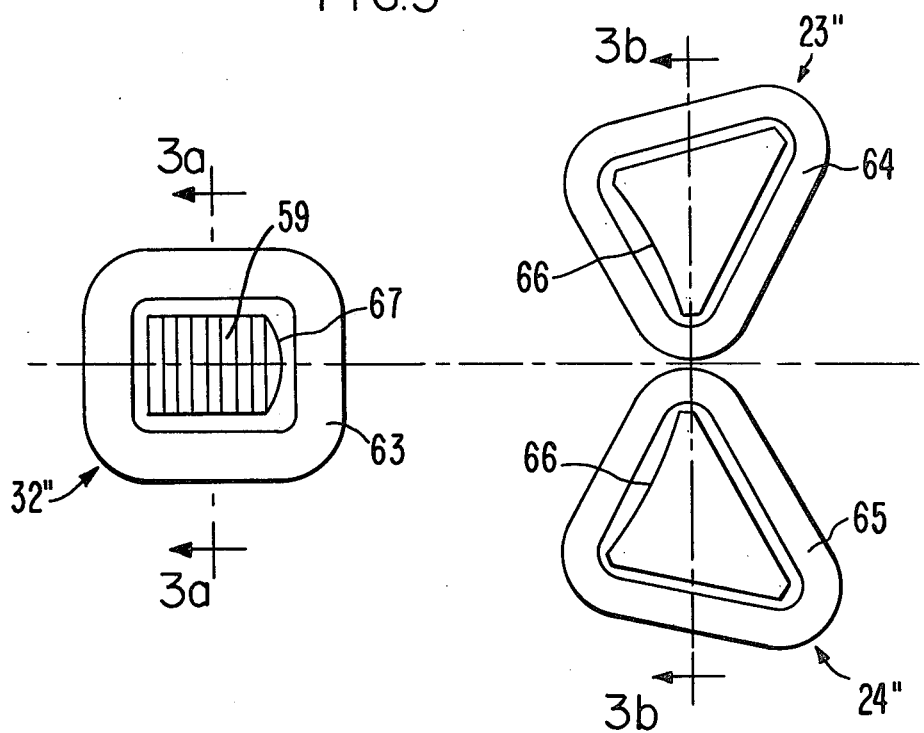
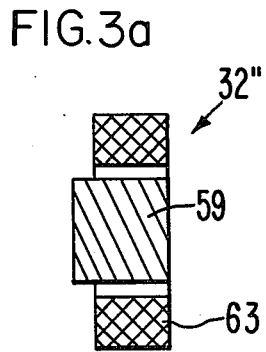
FIG. 3a
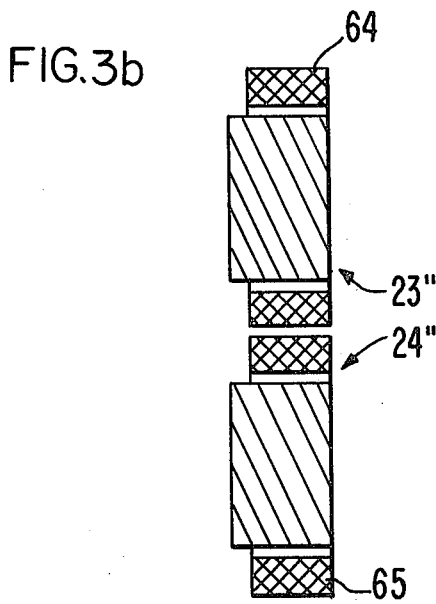
FIG. 3b

FOCUSING APPARATUS FOR UNIFORM APPLICATION OF CHARGED PARTICLE BEAM

DESCRIPTION

This invention is related to an apparatus for double deflection scanning of a charged particle beam and, more particularly, relates to a focusing apparatus for performing double deflection scanning of a charged particle beam.

Charged particle beam systems typically incorporate a source of charged particles, an accelerator tube, separator or momentum analyzer unit and a target. To achieve uniform distribution of the charged particle beam over the target or to reduce heating, the target is sometimes moved with respect to a fixed beam as in Arndt, Jr., et al., U.S. Pat. No. 3,983,402, "Ion Implantation Apparatus" or in G. I. Robertson, U.S. Pat. No. 3,778,626, "Mechanical Scan System for Ion Implantation"; alternatively, the beam may be electromagnetically scanned with respect to the target. See P. D. Townsend, et al., *Ion Implantation, Sputtering and Their Applications*, pp. 171 et. seq., (Academic Press 1976). The latter approach inherently introduces a variable angle of incidence for the beam with respect to the surface of the target. If the target is a semiconductor wafer being processed in an ion implantation machine, this variable angle of incidence may lead to variable depths of penetration which may be further exacerbated due to the effects of channeling and may lead to other non-uniformities; this effect is enhanced as wafer diameters increase. Such variable depths of penetration are undesirable in semiconductor devices. (See G. R. Brewer, U.S. Pat. No. 3,569,757, column 1, lines 20–59).

The variable angle of incidence of an electromagnetically scanned charged particle beam has been substantially eliminated in the prior art by deflecting the beam in a direction lateral to the beam path and then counter-deflecting the beam in the opposite direction to remove the lateral velocity component. The initial velocity component (source-to-target) is not disturbed but the charged particle is laterally displaced. See G. Dearnaley, et al., *Ion Implantation*, pp. 404–406 (1973); G. R. Brewer, U.S. Pat. No. 3,569,757, "Acceleration System for Implanting Ions in Specimen"; J. E. Wolfe, U.S. Pat. No. 4,117,339, "Double Deflection Electron Beam Generator for Employment in the Fabrication of Semiconductor Devices", and M. Thomson, "Abberations and Tolerances in a Double-Deflection Electron Beam Scanning System", J. Vacuum Science and Technology, V. 12, p. 1156 (1975). In these double deflection systems either a pair of charged plates has been employed to accomplish electrostatic deflection or a collection of electromagnets operating in an alternating current mode have been employed to accomplish magnetic deflection. Thus, the accomplishment of complete double-deflection requires two pairs of plates for electrostatic deflection or requires at least a pair of electromagnets operating in an alternating current mode for magnetic deflection. If both x and y deflections are accomplished, then twice again as many plates or electromagnets are required.

It is accordingly an object of the present invention to accomplish double deflection scanning of a charged particle beam by a focusing apparatus utilizing an electromagnet operating in a direct current mode.

It is a further object of the present invention to accomplish double deflection scanning of a charged particle beam with a minimum of aberration and error.

It is an additional object of the present invention to avoid the hot spots associated with neutral particles in the double deflection scanning of a charged particle beam.

It is a still further object of the present invention to provide end station switching in the scanning of a charged particle beam.

BRIEF DESCRIPTION OF THE DRAWINGS

For a more complete understanding of the apparatus of the present invention, reference may be had to the accompanying drawings which are incorporated herein by reference and in which:

FIG. 3 is a plan cross sectional view of the components of one embodiment of the focusing apparatus of the present invention;

FIG. 3a is a partial cross-sectional view of FIG. 3 illustrating configuration of the means for introducing variations in the ion beam angle; and FIG. 3b is another partial cross sectional view of FIG. 3 illustrating configuration of the parallel scan corrector magnets.

SUMMARY OF THE INVENTION

Figure 1:
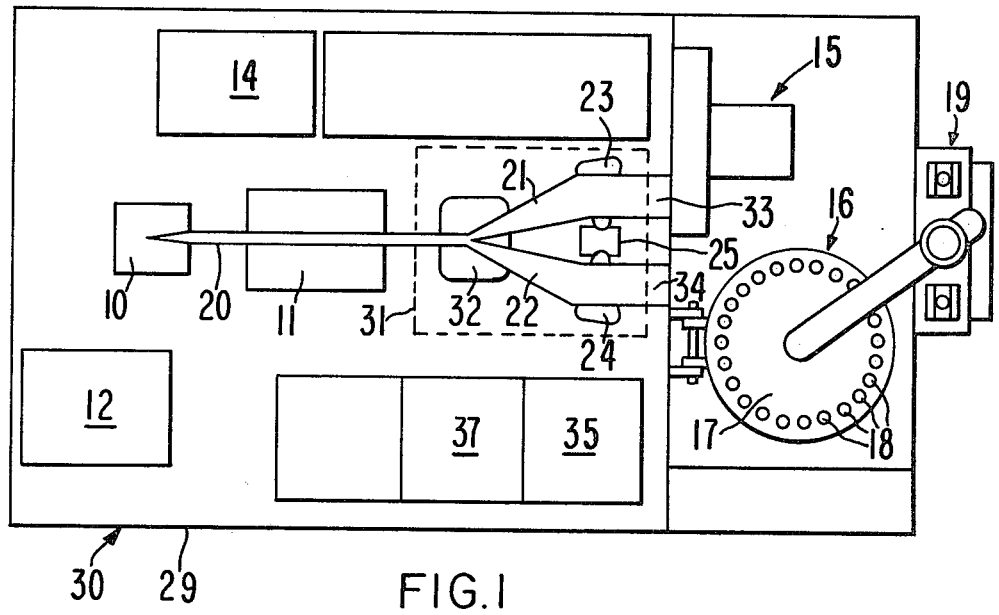
FIG. 1 is a plan view of a dual end station ion implantation machine incorporating the focusing apparatus of a present invention.

An apparatus for performing double deflection scanning of charged particle beams utilizes the focal or optical properties of a sector magnet in combination with a means for introducing variations in the angle of the charged particle beam. The means for introducing angular variations receives a charged particle beam and varies the angle of, i.e., deflects, the beam in a plane to define a time modulated beam fan. This variable angle deflection means may be electrostatic, magnetic or mechanical. Once the beam angle is varied the beam is introduced to the gap between the poles of a sector magnet operating in a direct current mode. The focal properties of the sector magnet translates the time modulated beam fan into a time modulated parallel beam. The parallel beam is double deflected and may be used, for example, as the substrate impinging beam in ion implantation equipment. Multiple sector magnets may be employed for multiple end stations.

DESCRIPTION OF THE PREFERRED EMBODIMENTS

As set out previously there are two approaches to the delivery of a uniform concentration of charged particles to a target. In an ion implantation system these approaches attempt to deliver a uniform dose of ions to a semiconductor wafer by either mechanically scanning the wafer across the path of a fixed ion beam or by electromagnetically scanning an ion beam across the surface of a semiconductor wafer held in a fixed position. Obtaining a reciprocating transverse scan in the first instance presents a difficult mechanical problem and introduces limitations on scanning rates due to the acceleration and deceleration required at the end of each scan. Scanning over the area of a wafer by strictly electromagnetic means is difficult because electrostatic plate displacements or magnet gap lengths need to be large to accommodate the scan. This leads to high field strengths, energy inefficiencies and fringing fields which in turn cause undesirable effects. A hybrid scanning system in which the best features of both approaches are incorporated provides advantages over the adoption of either individual approach. If such a system incorporates rotary scanning for the target, i.e., the fixture on which the semiconductor wafer is mounted, high scanning rates can be achieved in what is essentially one linear direction by the arcuate travel of the spinning target, provided the height of the transverse scan is not great. See, for example, the discussion of pattern traces in G. I. Robertson, U.S. Pat. No. 3,778,626. The transverse scan is a time modulated function and can be nicely achieved by magnetic means, particularly by double deflection magnetic scanning. This is possible because the deflection forces are impressed on the moving ion in a direction orthogonal to the direction of the magnetic field ($\vec{B}$) and orthogonal to the direction of the ion's velocity. Since the deflection (and redeflection) occurs in the plane which bisects the two gaps, the gaps may be relatively small. Electrostatic deflection, on the other hand, requires larger gaps to be used since the deflection force is impressed in the direction of the electric field ($\vec{E}$) and the scan occurs along the gap length. Alternative to the magnetic scan/rotational scan combination, a first transverse scan can be produced by magnetic means and a second scan perpendicular thereto can be obtained by electrostatic means. With either combination the target is mounted sensibly orthogonal to the impinging ion beam or is oriented at some small fixed angle with respect thereto. The focusing apparatus for double deflection scanning of the present invention is thus readily adaptable for incorporation into one of these hybrid scanning systems.

Double deflection scanning, as discussed previously, is a natural technique to produce lateral displacement of a beam having a reasonable height. Large beam heights are not ideally suited for magnetic scanning because gap lengths would be too large and would require inordinately high field strengths. With such double deflection scanning careful matching of the deflection and redeflection magnetic field strengths must be obtained if dose uniformity is important. Since typically ion dose must be maintained within a uniformity of 1%, matching is required if separate magnets are employed. This problem is heightened if both deflection and redeflection magnets are operating in an alternating current mode. The focusing apparatus of the present invention partially eliminates this problem as it relies upon the focal or optical properties of a sector magnet operating in a DC mode to accomplish redeflection. (It should be noted that sector magnets usually are operated in reverse, i.e., from parallel-to-point source, rather than from point-to-parallel, but the principle is the same.) The focal properties of sector magnets are known and serve to provide, in the focusing apparatus of the present invention, the focusing function set out in the subsequent section entitled "Operation". See H. A. Enge, "Deflecting Magnets", pp. 203, 218, et seq., in *Focusing of Charged Particles*, V. II, A Septier, ed. (1967). Thus, the B field in the sector magnet need be set once in accordance with the energy and mass of the ionic species and thereafter point-to-parallel focusing will result. This phenomenon can be seen in the trajectories shown in the Figures.

STRUCTURE

In FIG. 1 an ion implantation machine 30 in which the focusing apparatus of the present invention is employed may be seen. The frame 29 supports the ion source 10, ion source power and gas supply 12, momentum analyzer 11, and high voltage power supply 14. The dual end station comprises rotating disc assemblies 15 and 16, and control panel 19. The focusing apparatus of the present invention, shown within dotted line 31, comprises a magnetic means 32 for introducing a variable angle into charged particle beam 20, a first sector magnet 23, a second sector magnet 24 and a neutral beam trap 25. Beam trap 25 stops and collects unwanted neutral particles. Alternating current power supply 37 energizes the coils of magnetic means 32 and direct current power supply 35 energizes at successive times the sector magnet pairs 23 and 24. In an alternative embodiment a dual gap electromagnet is used to produce the two sector magnets. This magnet is of the physical type disclosed in the co-pending application of Hanley, et al., "Unitary Electromagnet for Double Deflection Scanning of Charged Particle Beam", Ser. No. 164,415, filed June 30, 1980, a continuation of Ser. No. 45,035, filed June 4, 1979, now abandoned. However, the dual gap magnet is operated in a direct current mode transverse to the principal beam direction rather than as the sole means of performing double deflection scanning. It simply provides an economic and energy efficient configuration for a dual end station double deflection system which incorporates the focusing apparatus of the present invention. Both sector magnets need to produce a force which redeflects particles to the original axis and the dual gap electromagnet will intrinsically have opposite polarities in the two gaps thereby allowing the two force fields produced by the opposing sector magnets to be directed towards the original axis.

Figure 2:
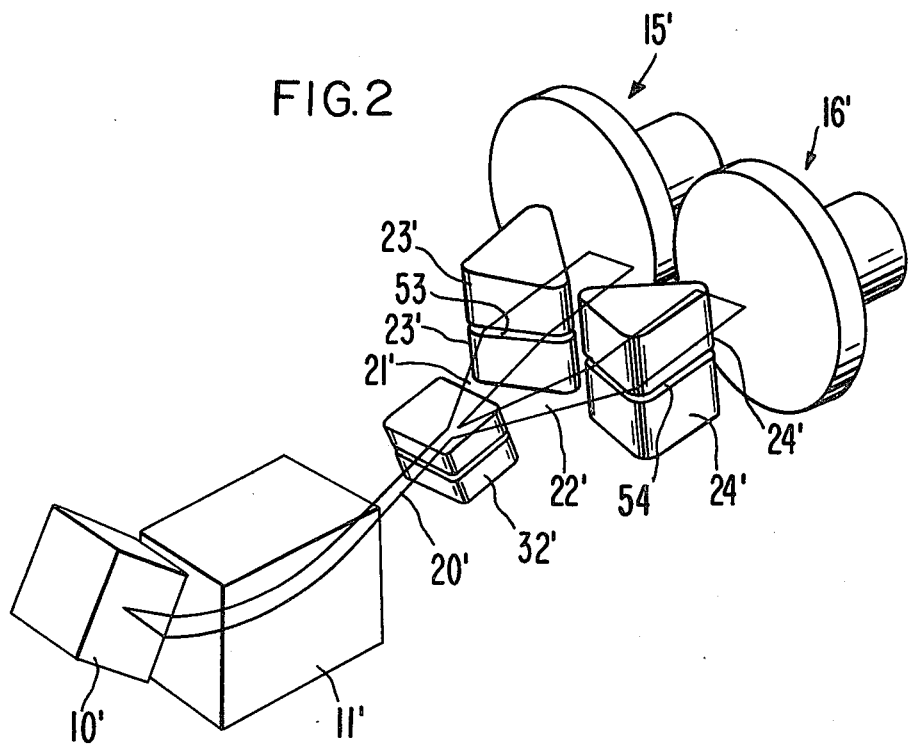
FIG. 2 is a pictorial perspective view of the focusing apparatus of the present invention shown in conjunction with the ion source, mass analyzer and target discs.

Further insight into the configuration of the focusing apparatus of the present invention can be obtained from FIG. 2. The symmetric beam fans 21' and 22' are seen to be essentially planar and to pass through narrow gaps 53 and 54 between sector the poles of sector magnets 23' and 24', respectively. These gap lengths are on the order of 4 cm. As discussed previously, the vertical scan is obtained by the rotation of discs 15' and 16', respectively.

The structure of the magnetic means for introducing the variable angle into the charged particle beam is shown in FIGS. 3 and 3a. Since the charged particle beam which enters magnet 32" is collimated, the dimensions of magnet 32" may be quite small since the variable angles may be introduced before significant divergence of the beam has occurred. Thus, a compact conventional electromagnet with windings 63 and pole pieces 59 may be employed. The sector magnets 23" and 24" must be larger to accommodate the widths of the beam fan. The sector magnets are of conventional construction, i.e., they permit parallel-to-point focusing (or point-to-parallel as with the present invention). The contours 66 of the incoming faces of the sector magnets as seen in FIG. 3 are given a slight concave shape to correct for angular abberations in the point-to-parallel optics. The sector magnets are of conventional wire wound, ferromagnetic metal core construction, as shown in FIG. 3b. The contour 67 of the exit face of magnet 32" is given a slight convex shape to provide additional correction for angular abberations in the point-to-parallel optics. The second order corrections accomplished by the entrance and exit pole contours provide good mass resolution which is realized by a mass slit (not shown) positioned between magnets 23" and 24" and the rotating discs.

OPERATION

As seen in FIG. 1, the charged particle beam 20 emerges from ion source 10, passes through mass analyzer 11, has a variable angle introduced by magnetic means 32 which is driven by alternating current power supply 31 to accomplish, in a controllable manner, a deflection or switching into symmetric time modulated beam fans 21 and 22 (shown for purposes of illustration to exist at the same time although in actual operation only one beam fan would exist at a given point in time), and then is transformed by the parallel scan compensation of the sector magnets 23 and 24 into parallel time modulated beams 33 and 34 which then impinge on semiconductor wafers, e.g., wafers 18, mounted on one of the rotating disc assemblies 15 or 16. In practice one end station would be in operation while the other is being loaded. Thus, the power supply 31 which energizes magnetic means 32 is controlled by control panel 19 so that the appropriate time modulated beam fan is produced for the rotating disc which is loaded and in place.

The minimum height of the beam, i.e., the deviation above and below the plane of the beam fans will depend largely upon the optical properties of the incident beam. The focusing apparatus of the present invention is preferably optically neutral with respect to the beam in the direction normal to the beam fans so that forces are only imparted in the plane of the beam fans. Optical properties may be introduced if, for example, it is desired to deliberately produce channeling in semiconductor wafers. This can be done by varying the gap areas or by further shaping the pole faces of the sector magnets. If a specific beam height is to be obtained then the relative positions of the focusing apparatus and momentum analyzer can be altered to defocus the beam and increase the height. If a rotating disc is used for mounting semiconductor wafers then the interaction of the rotational scan of a semiconductor wafer mounted on rotating disc 17 and the transverse scan is comparable to the pattern trace discussed in Robertson, U.S. Pat. No. 3,778,626.

Since magnetic means 32 in FIG. 1 (32' in FIG. 2) which is used to introduce variations in the beam angle is compact, as discussed above, the energy stored in the gaps is relatively small. Furthermore, reliance upon the focusing or optical properties of the sector magnets 23 and 24 in FIG. 1 (23' and 24' in FIG. 2) permits the sector magnets to be operated in a direct current (non time modulated) mode. The result is energy efficient operation as compared with prior art scanning systems utilizing electromagnets operating in an alternating current mode.

In operation the machine operator will simply select the appropriate level from power supply 35 which produces a B field across the sector magnets 23 and 24 which is sufficient to provide parallel scan compensation. The direction of the field will depend upon the polarity of the charge on the particles and will necessarily be chosen to produce a force which redeflects particles towards the original axis of the charged particle beam. The requisite field will depend upon the mass of the particles, the charge on the particles and the energy to which they are accelerated. The geometrical configuration of the system will already have been factored in. A single setting, then, will suffice for a particular run.

I claim:

1. A focusing apparatus for uniform application of a charged particle beam over the exposed surfaces of a plurality of targets comprising:
    first deflection means for introducing a variable angle into a charged particle beam;
    control means for driving said first deflection means to produce a time modulated fan beam having selected angular limits;
    a sector magnet having a time independent magnetic field and arranged in opposition to said first deflection means to produce a gap normal to the plane of said time modulated fan beam for receiving said fan beam and positioned with the edge formed by the intersection of the entrance and exit ends lying adjacent the plane of the original trajectory of said charged particle beam so as to transform said fan beam into a time modulated ribbon beam; and
    means for producing relative transverse motion between said targets and said time modulated ribbon beam.

2. A focusing apparatus for uniform application of a charged particle beam in accordance with claim 1 wherein said means for producing relative transverse motion is an electrostatic means for moving said ribbon shaped beam with respect to said targets.

3. A focusing apparatus for uniform application of a charged particle beam in accordance with claim 1 wherein said means for producing relative transverse motion is a mechanical means for moving said targets with respect to said ribbon shaped beam.

4. A focusing apparatus for uniform application of a charged particle beam in accordance with claim 3 wherein said mechanical means is a rotatable disc on which said targets are mounted.

5. A focusing apparatus for uniform application of a charged particle beam in accordance with claim 4 wherein said first deflection means comprises an electromagnet and said control means includes an alternating current power supply.

6. A focusing apparatus for uniform application of a charged particle beam in accordance with claim 5 wherein said electromagnet has pole pieces with convex contours on their exit ends.

7. A focusing apparatus for uniform application of a charged particle beam in accordance with claim 6 wherein said sector magnet has pole pieces with concave contours on their entrance ends.

8. A focusing apparatus for uniform application of a charged particle beam in accordance with claim 5 in combination with a second sector magnet having a time independent magnetic field and arranged in opposition to said electromagnet to produce a gap normal to the plane of a second time modulated fan beam produced by said electromagnet for receiving said second fan beam and positioned with the edge formed by the intersection of the entrance and exit ends lying adjacent said plane of said original trajectory of said charged particle beam so as to transform said second fan beam into a second time modulated ribbon beam, said sector magnet and said second sector magnet being disposed symmetrically about said plane, and additional means for producing relative transverse motion between certain of said targets and said second time modulated ribbon beam.

9. A focusing apparatus for uniform application of a charged particle beam in accordance with claim 8 wherein said sector magnet and said second sector magnet comprise a single dual gap electromagnet positioned transverse to the original trajectory of said charged particle beam and having a constant magnetic field oriented to operate on said time modulated beam fan and said second time modulated fan beam to produce, respectively, said time modulated ribbon beam and said second time modulated ribbon beam.

10. The method of scanning a charged particle beam uniformly over the exposed surface of targets mounted on a workpiece comprising:

deflecting the beam through an angular interval from an initial direction on a time modulated basis so as to form a fan shaped beam;

subjecting said fan-shaped beam to a time independent magnetic field produced by a sector magnet positioned with the edge formed by the intersection of the entrance and exit ends lying adjacent the plane of the original trajectory of said charged particle beam in order to reshape said fan-shaped beam into a ribbon-shaped beam, and producing relative transverse motion between said ribbon-shaped beam and said targets.

11. The method of scanning a charged particle beam in accordance with claim 10 wherein said step of deflecting the beam is accomplished by the step of subjecting the beam to a time dependent magnetic field.

* * * * *